US009048855B2

(12) United States Patent
Bae et al.

(10) Patent No.: US 9,048,855 B2
(45) Date of Patent: Jun. 2, 2015

(54) METHOD AND APPARATUS FOR PARALLEL DATA INTERFACING USING COMBINED CODING AND RECORDING MEDIUM THEREFOR

(71) Applicant: SAMSUNG ELECTRONICS CO., LTD., Suwon-si, Gyeonggi-do (KR)

(72) Inventors: Seung Jun Bae, Hwaseong-si (KR); Jong Keun Ahn, Yongin-si (KR); Kwang Chol Choe, Seoul (KR)

(73) Assignee: SAMSUNG ELECTRONICS CO., LTD, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/047,377

(22) Filed: Oct. 7, 2013

(65) Prior Publication Data
US 2014/0035765 A1 Feb. 6, 2014

Related U.S. Application Data

(60) Division of application No. 13/040,606, filed on Mar. 4, 2011, now Pat. No. 8,552,891, and a continuation-in-part of application No. 12/923,858, filed on Oct. 12, 2010, now abandoned, and a
(Continued)

(30) Foreign Application Priority Data

May 27, 2006 (KR) .......................... 10-2006-0047857
Mar. 5, 2010 (KR) .......................... 10-2010-0020143

(51) Int. Cl.
*H03M 5/00* (2006.01)
*H03K 19/003* (2006.01)
*H04L 25/03* (2006.01)
(Continued)

(52) U.S. Cl.
CPC ........... *H03M 5/00* (2013.01); *H03K 19/00346* (2013.01); *H04L 25/03866* (2013.01); *H04L 25/14* (2013.01); *H04L 25/4908* (2013.01)

(58) Field of Classification Search
CPC .................. H03K 19/00346; H04L 25/03866; H04L 25/4908; H03M 5/00
USPC ................... 341/58, 59, 65, 67, 95, 100, 101; 714/704, 701, 762, 788
See application file for complete search history.

(56) References Cited

U.S. PATENT DOCUMENTS

| 5,739,779 A | 4/1998 | Kunisa et al. |
| 5,841,378 A | 11/1998 | Klayman et al. |
| 6,008,745 A | 12/1999 | Zanki et al. |

(Continued)

FOREIGN PATENT DOCUMENTS

KR    10-2004-0012677 A    2/2004

*Primary Examiner* — Linh Nguyen
(74) *Attorney, Agent, or Firm* — Lee & Morse, P.C.

(57) ABSTRACT

A semiconductor device may include a coding lookup table unit including a plurality of coding lookup tables each of which is selected by a respectively selection signal, and a selection unit configured to receive one of N-bit parallel data and extract respective encoded data corresponding to the selection signal and to which the N-bit parallel data is mapped from the coding lookup table unit, and encoded data and extract respective N-bit parallel data corresponding to the selection signal and to which the encoded data is mapped from the coding lookup table unit, wherein N is 2 or an integer greater than 2, and wherein the coding lookup tables respectively store a plurality of coded data patterns that respectively correspond to patterns of the N-bit parallel data and are random temporally and spatially.

8 Claims, 21 Drawing Sheets

Related U.S. Application Data continuation of application No. 12/453,109, filed on Apr. 29, 2009, now Pat. No. 7,830,280, and a continuation of application No. 11/802,886, filed on May 25, 2007, now Pat. No. 7,541,947.

(51) Int. Cl.
 *H04L 25/14* (2006.01)
 *H04L 25/49* (2006.01)

(56) References Cited

U.S. PATENT DOCUMENTS

| | | |
|---|---|---|
| 6,195,764 B1 | 2/2001 | Caldara et al. |
| 6,219,457 B1 | 4/2001 | Potu |
| 6,388,590 B1 | 5/2002 | Ng |
| 6,420,980 B1 | 7/2002 | Ejima |
| 6,425,107 B1 | 7/2002 | Caldara et al. |
| 6,618,395 B1* | 9/2003 | Kimmitt ............... 370/473 |
| 6,628,725 B1* | 9/2003 | Adam et al. .......... 375/259 |
| 6,650,638 B1* | 11/2003 | Walker et al. ........ 370/389 |
| 6,662,332 B1* | 12/2003 | Kimmitt ............... 714/762 |
| 6,703,949 B2 | 3/2004 | Greenstreet |
| 6,734,811 B1 | 5/2004 | Cornelius |
| 6,812,870 B1 | 11/2004 | Kryzak et al. |
| 6,862,701 B2 | 3/2005 | Walker et al. |
| 6,920,604 B2 | 7/2005 | Coakeley et al. |
| 6,937,067 B2 | 8/2005 | Neaves |
| 6,986,094 B2 | 1/2006 | Grimsrud |
| 7,006,016 B1 | 2/2006 | Feng |
| 7,055,073 B2 | 5/2006 | Walker et al. |
| 7,180,958 B2 | 2/2007 | Bessios et al. |
| 7,185,036 B1 | 2/2007 | Wang et al. |
| 7,245,633 B1 | 7/2007 | Mueller |
| 7,274,315 B2 | 9/2007 | Baumer |
| 7,541,947 B2 | 6/2009 | Bae et al. |
| 7,634,694 B2 | 12/2009 | Green et al. |
| 7,646,319 B2 | 1/2010 | Pang et al. |
| 7,668,312 B2 | 2/2010 | Lecomte et al. |
| 7,734,105 B2 | 6/2010 | Ström et al. |
| 7,876,900 B1* | 1/2011 | Goergen ............... 380/255 |
| 2002/0097703 A1* | 7/2002 | Nieczyporowicz et al. .. 370/342 |
| 2002/0129307 A1 | 9/2002 | Walker et al. |
| 2003/0016754 A1 | 1/2003 | Gandhi et al. |
| 2003/0135798 A1 | 7/2003 | Katayama et al. |
| 2004/0088633 A1* | 5/2004 | Lida et al. ............ 714/752 |
| 2004/0228364 A1* | 11/2004 | Walker et al. ........ 370/470 |
| 2006/0220926 A1 | 10/2006 | Ito et al. |
| 2006/0268997 A1 | 11/2006 | Thaler |
| 2007/0101241 A1 | 5/2007 | Hoyer |
| 2007/0165698 A1 | 7/2007 | Haque et al. |
| 2008/0089423 A1 | 4/2008 | Karczewicz |
| 2008/0089424 A1 | 4/2008 | Karczewicz et al. |
| 2009/0010362 A1* | 1/2009 | Thaler ................. 375/340 |
| 2011/0194627 A1 | 8/2011 | Fukuda et al. |

* cited by examiner

FIG. 4A (RELATED ART)

| DQ1 | 1 | 0 | 1 | 1 | 0 |
|---|---|---|---|---|---|
| DQ2 | 0 | 1 | 0 | 1 | 0 |
| DQ3 | 1 | 0 | 0 | 1 | 0 |
| DQ4 | 1 | 0 | 0 | 1 | 0 |
| DQ5 | 1 | 0 | 0 | 1 | 0 |
| DQ6 | 0 | 1 | 1 | 0 | 1 |
| DQ7 | 1 | 0 | 1 | 0 | 1 |
| DQ8 | 0 | 1 | 1 | 0 | 1 |
| DQ9 | 0 | 1 | 1 | 0 | 1 |
| DQ10 | 1 | 0 | 0 | 0 | 1 |

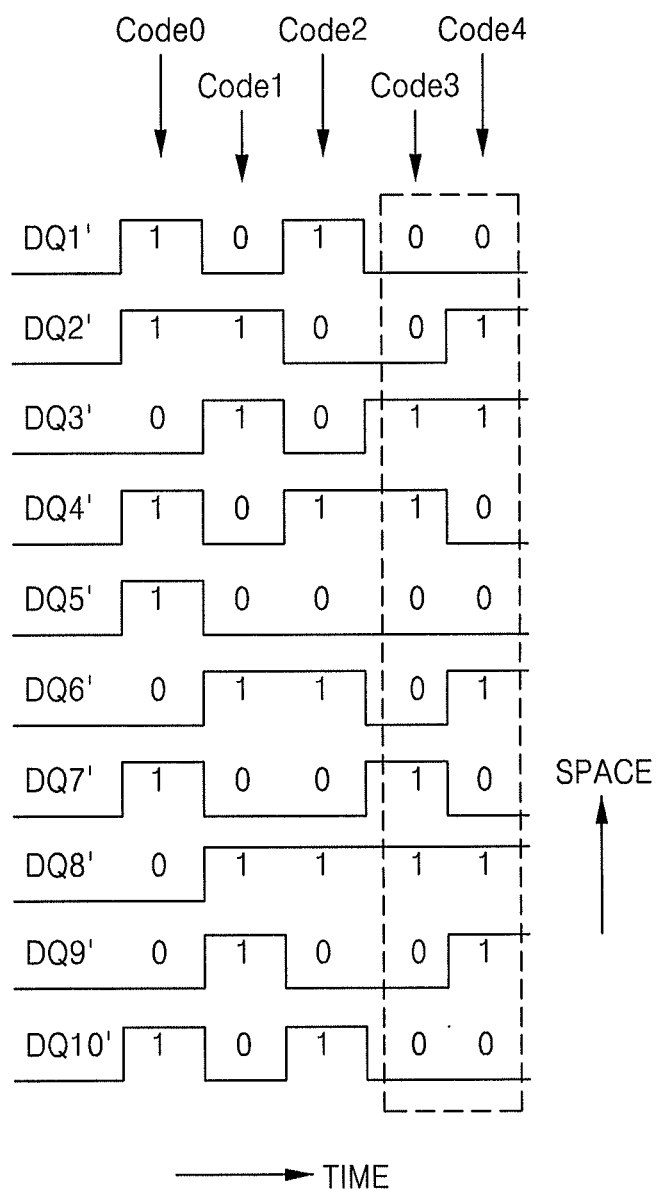

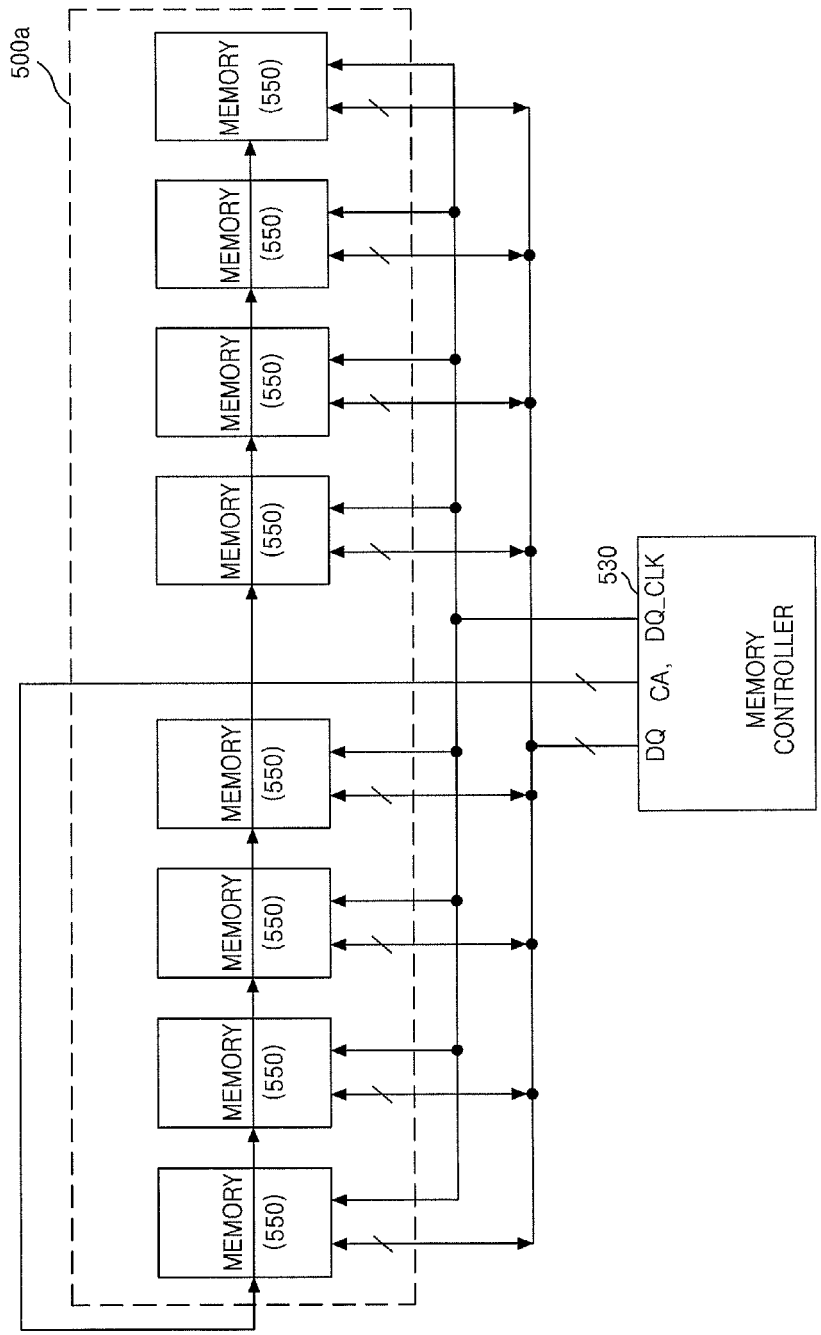

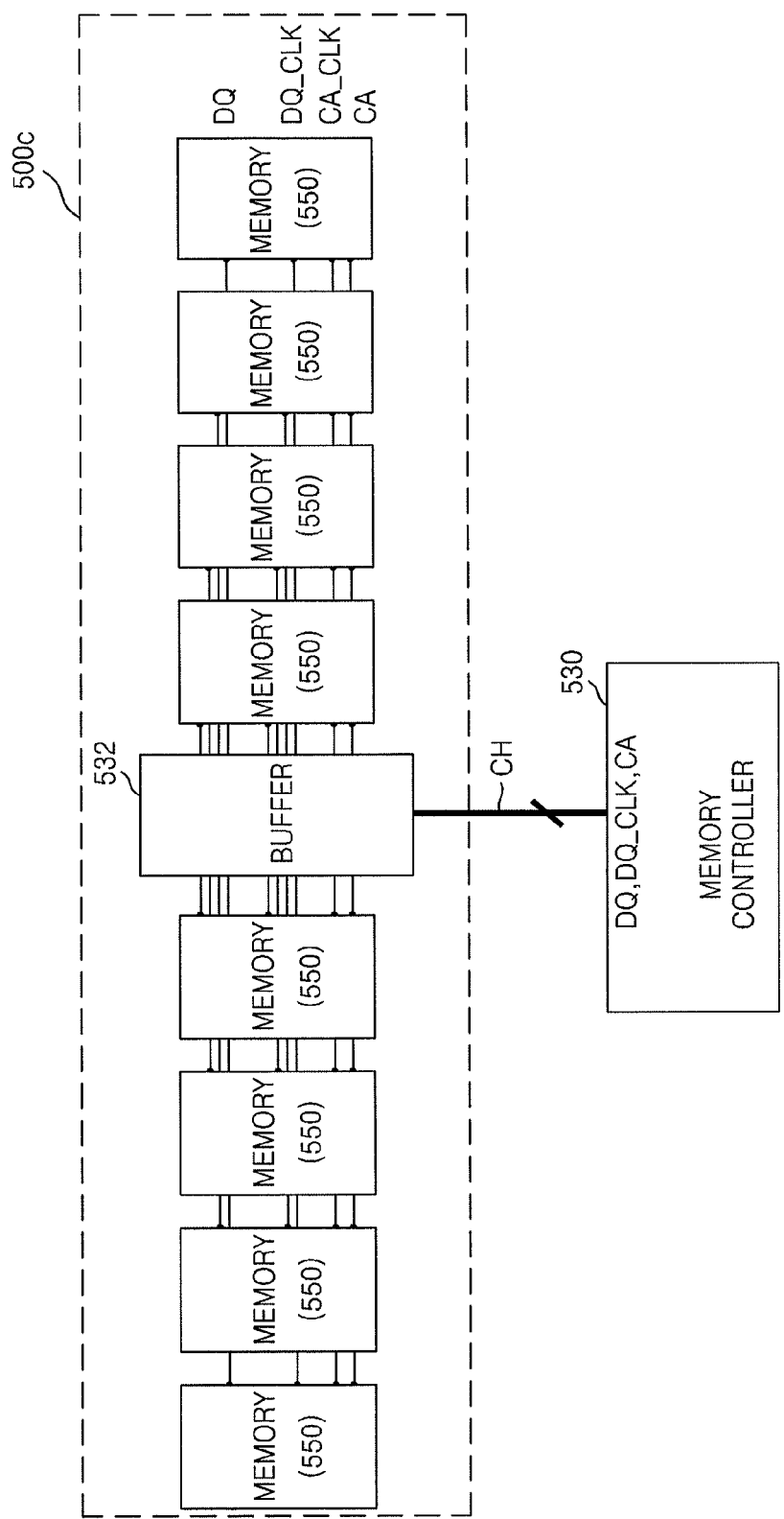

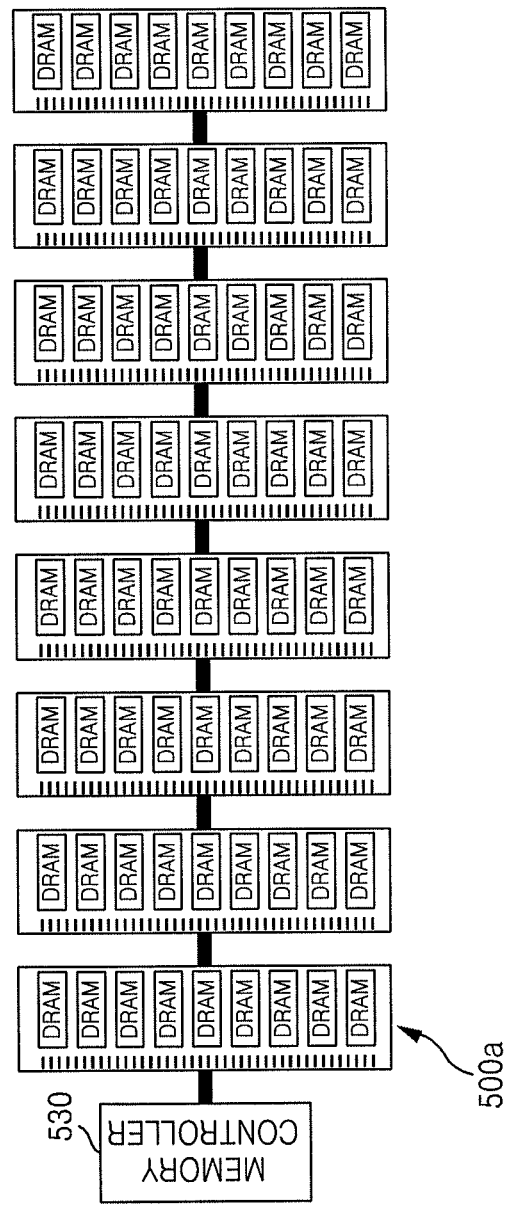

METHOD AND APPARATUS FOR PARALLEL DATA INTERFACING USING COMBINED CODING AND RECORDING MEDIUM THEREFOR

CROSS-REFERENCE TO RELATED APPLICATIONS

This application is a division of pending application Ser. No. 13/040,606, filed Mar. 4, 2011, which in turn is a CIP (continuation in part) of U.S. patent application Ser. No. 12/923,858 filed on Oct. 12, 2010, which is a continuation of U.S. patent application Ser. No. 12/453,109 filed on Apr. 29, 2009, now U.S. Pat. No. 7,830,280, issued on Nov. 9, 2010, which is a continuation of U.S. patent application Ser. No. 11/802,886 filed on May 25, 2007, now U.S. Pat. No. 7,541,947, issued on Jun. 2, 2009, which claims the priority of Korean Patent Application No. 10-2006-0047857, filed on May 27, 2006, in the Korean Intellectual Property Office, the disclosure of each of which is incorporated herein in its entirety by reference.

This application also claims priority under 35 U.S.C. §119 to Korean Patent Application No. Korean Patent Application No. 10-2010-0020143, filed on Mar. 5, 2010, in the Korean Intellectual Property Office, and entitled: "Method and Apparatus for Parallel Data Interfacing Using Combined Coding and Recording Medium Therefor," which is incorporated by reference herein in its entirety.

BACKGROUND

1. Field

Embodiments relate to a method, recording medium and apparatus for parallel data interface, and more particularly, to a parallel interface method for reducing noise in a parallel data interface system, a recording medium for recording the method, and a semiconductor device therefor.

2. Description of the Related Art

A parallel input/output circuit of a semiconductor device (e.g., dynamic random access memory (DRAM) or a controller) using a single-ended parallel transmission for parallel data interface has noise (e.g., jitter, voltage noise, or reference fluctuation) caused by parasitic inductance. Noise can reduce a voltage margin and a time margin, and can limit a transmission rate or a transmission frequency thereof.

SUMMARY

One or more embodiments may provide a parallel interface method and apparatus for reducing and/or minimizing both direct current (DC) noise and switching noise in a parallel interface system and a recording medium for recording the method.

One or more embodiments may provide a single-parallel interface system having reduced and/or minimal changes in load current (e.g., DC current) and switching current.

One or more embodiments may provide a method for reducing changes in both load current (i.e., DC current) and switching current in a single-ended parallel interface system using a balance code and a recording medium for recording the method.

One or more embodiments may provide a semiconductor device, including a coding lookup table unit including a plurality of coding lookup tables each of which is selected by a respective selection signal, and a selection unit configured to receive one of N-bit parallel data and extract respective encoded data corresponding to the selection signal and to which the N-bit parallel data is mapped from the coding lookup table unit, and encoded data and extract respective N-bit parallel data corresponding to the selection signal and to which the encoded data is mapped from the coding lookup table unit, wherein N is 2 or an integer greater than 2, and wherein the coding lookup tables respectively store a plurality of coded data patterns that respectively correspond to patterns of the N-bit parallel data and are random temporally and spatially.

The selection signal may include at least part of one signal among an address signal, a burst length signal, and a command signal.

The semiconductor device may further include an output driver configured to output the encoded data through a plurality of data lines.

The coding lookup table unit is an encoding lookup table unit including a plurality of encoding lookup tables, and the selection unit is configured to receive N-bit parallel data and extract respective encoded data that corresponds to the selection signal and to which the N-bit parallel data is mapped from the encoding lookup table unit, and the coded data stored by the encoding lookup tables is a plurality of encoded data patterns that respectively correspond to patterns of the N-bit parallel data and are random temporally and spatially.

The selection unit may include a selector configured to select and output the encoded data corresponding to the selection signal among a plurality of sets of encoded data respectively output from the plurality of encoding lookup tables.

The encoded data is obtained by scrambling and direct current (DC) balance encoding the N-bit parallel data.

The coding lookup table unit is a decoding lookup table unit including a plurality of decoding lookup tables and the selection unit is configured to receive encoded data and extract N-bit parallel data that corresponds to the selection signal and to which the encoded data is mapped from the decoding lookup table unit, and the coded data stored by the decoding lookup tables is a plurality of N-bit parallel data patterns that respectively correspond to patterns of the encoded data which are random temporally and spatially.

The selection unit may include a selector configured to select and output the N-bit parallel data corresponding to the selection signal among a plurality of sets of N-bit parallel data respectively output from the plurality of decoding lookup tables.

The N-bit parallel data is obtained by direct current (DC) balance decoding and descrambling the encoded data.

One or more embodiments may provide a semiconductor device including a scrambling code generator configured to generate a scrambling code using a seed; a scrambler configured to scramble a first parallel data group, which includes at least two sets of N-bit parallel data, using the scrambling code and generate a second parallel data group, which includes at least two sets of N-bit scrambled parallel data, where N is 2 or an integer greater than 2; a balance encoding block configured to receive the second parallel data group, perform DC balance encoding of the N-bit scrambled parallel data sets in the second parallel data group, and generate M-bit balance codes, where M is an integer greater than N; and an output driver configured to sequentially output the balance codes and the seed through a plurality of data lines.

The balance encoding block may selectively invert the N-bit scrambled parallel data sets according to the number of bits having a first logic level or a second logic level in each of the N-bit scrambled parallel data sets and add a flag signal indicating inversion or non-inversion to each of the N-bit scrambled parallel data sets.

The scrambler may include a logical operator configured to perform an exclusive OR operation on bits in the first parallel data group and bits in the scrambling code one on one.

The output driver is configured to sequentially output the balance codes one by one through the plurality of data lines before outputting the seed through the plurality of data lines.

In one or more embodiments, a semiconductor device may include a data receiver configured to receive M-bit balance codes, each of which is obtained by DC balance encoding each sets of N-bit scrambled parallel data in a second parallel data group generated by scrambling a first parallel data group including at least two sets of N-bit parallel data, and a seed through a plurality of data lines, where M is 2 or an integer greater than 2 and N is an integer lesser than M; a descrambling code generator configured to generate a descrambling code using the seed; a balance decoding block configured to perform DC balance decoding of the balance codes and extract the second parallel data group including the at least two sets of N-bit scrambled parallel data; and a descrambler configured to descramble the second parallel data group extracted by the balance decoding block using the descrambling code and extract the first parallel data group.

The balance decoding block may selectively invert the balance codes according to a predetermined flag signal included in each of the balance codes.

The descrambler may include a logical operator configured to perform an exclusive OR operation on bits in the second parallel data group and bits in the descrambling code one on one.

The data receiver sequentially receives the balance codes one by one through the plurality of data lines and then receives the seed through the plurality of data lines.

In one or more embodiments, a memory device for storing data in compliance with a memory controller includes a data receiver configured to receive first parallel data from the memory controller through a plurality of data lines based on a write command of the memory controller, an encoder configured to encode the first parallel data and output encoded data, and a data storage unit configured to receive the encoded data through an internal bus of the memory device and store the encoded data.

The memory device may further include a decoder configured to decode data output from the data storage unit and an output driver configured to transmit output data of the decoder to the memory controller.

The encoder may include an encoding lookup table unit including a plurality of encoding lookup tables each of which is selected by a selection signal, and a selection unit configured to receive N-bit parallel data and extract encoded data which corresponds to the selection signal and to which the N-bit parallel data is mapped from the encoding lookup table unit, where N is 2 or an integer greater than 2, the encoding lookup tables respectively store a plurality of encoded data patterns which respectively correspond to patterns of the N-bit parallel data and which are random temporally and spatially.

The selection signal may include at least part of one signal among an address signal, a burst length signal, and a command signal.

The encoder may include a scrambling code generator configured to generate a scrambling code using a seed, and a scrambler configured to scramble a first parallel data group, which includes at least two sets of N-bit parallel data, using the scrambling code and generate a second parallel data group, which includes at least two sets of N-bit scrambled parallel data, where N is 2 or an integer greater than 2.

The encoder may include a balance encoding block configured to receive the second parallel data group, perform direct current (DC) balance encoding of the N-bit scrambled parallel data sets in the second parallel data group, and generate M-bit balance codes, where M is an integer greater than N.

BRIEF DESCRIPTION OF THE DRAWINGS

Features and advantages will become more apparent to those of ordinary skill in the art by describing in detail exemplary embodiments with reference to the attached drawings, in which:

FIG. 4A illustrates a diagram of parallel data coded using conventional 8B/10B balance coding;

FIG. 4B illustrates a diagram of encoded parallel data according to one or more embodiments;

FIGS. 9A through 9C illustrate schematic diagrams of memory modules according exemplary embodiments; and FIGS. 10A through 10D illustrate block diagrams of an exemplary embodiment of a memory system using the memory modules illustrated in FIGS. 9A through 9C.

DETAILED DESCRIPTION

Figure 1:
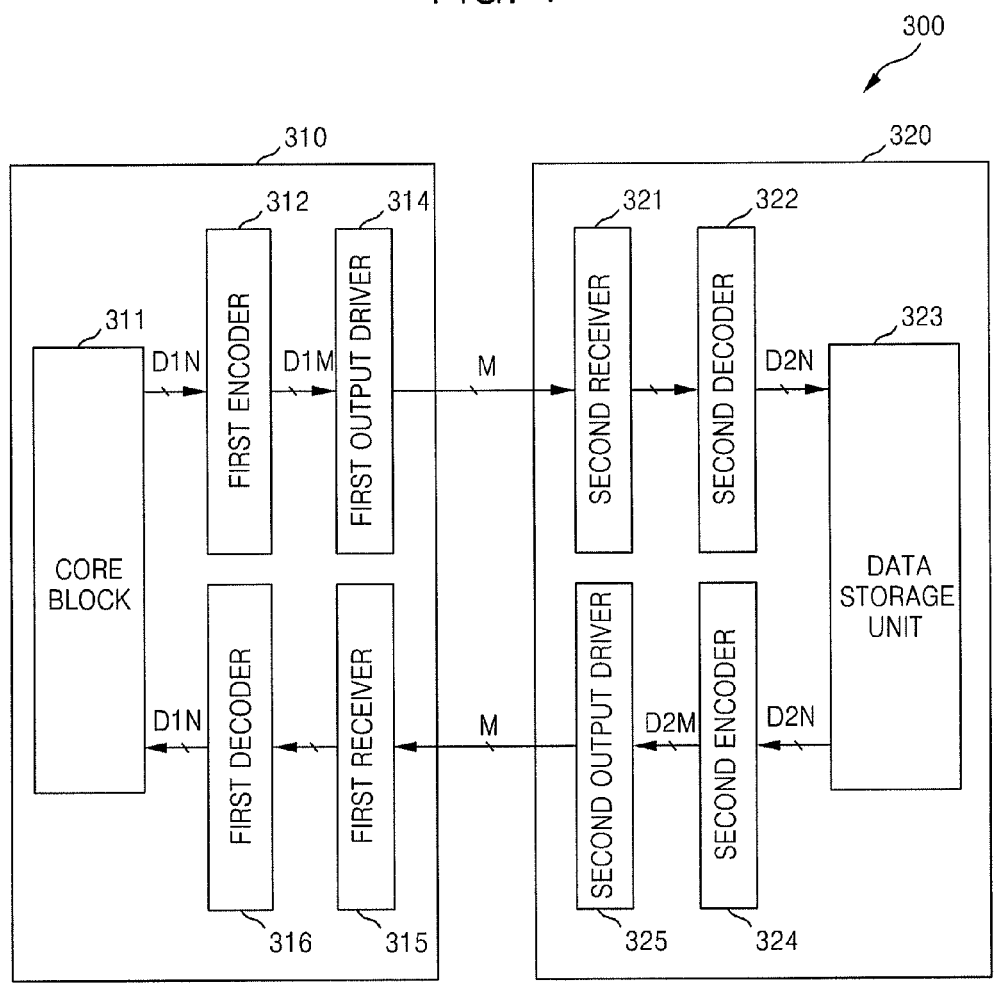
FIG. 1 illustrates a diagram of a system using single-ended parallel interface according to one or more embodiments.

Exemplary embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout the specification.

It will be understood that when an element is referred to as being "connected" to another element, it can be directly connected to the other element or intervening elements may be present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 illustrates a diagram of an exemplary parallel interface system 300 according to one or more embodiments. The parallel interface system 300 may include a first semiconductor device 310 and a second semiconductor device 320. The first semiconductor device 310 may be a memory controller and the second semiconductor device 320 may be a memory device such as dynamic random access memory (DRAM), static RAM (SRAM), or flash memory.

The first semiconductor device 310 may include a core block 311, a first encoder 312, a first output driver 314, a first receiver 315, and a first decoder 316. The core block 311 may include a microprocessor (not shown) and an internal memory (not shown). The core block 311 may generate a command and an address that are necessary to write data to the second semiconductor device 320 (e.g., DRAM) or read data from the second semiconductor device 320.

In one or more embodiments, the first encoder 312 may be a combined encoder, e.g., spatial and temporal based encoder. The first encoder 312 may receive a first parallel data group from the core block 311 and may convert it so that bits of 0 and bits of 1 in the first parallel data group are randomly or pseudo-randomly distributed spatially and temporally. The first parallel data group may include at least two sets of N (which is 2 or an integer greater than 2, e.g., 8)-bit parallel data DIN, for example, 8 sets of 8-bit parallel data DIN, and may be referred to as burst data.

Output data of the first encoder 312 may be a second parallel data group having a predetermined random number sequence. The second parallel data group may include at least two sets of M (which is an integer greater than N)-bit encoded data (or first encoded data) DIM.

Figure 2A:
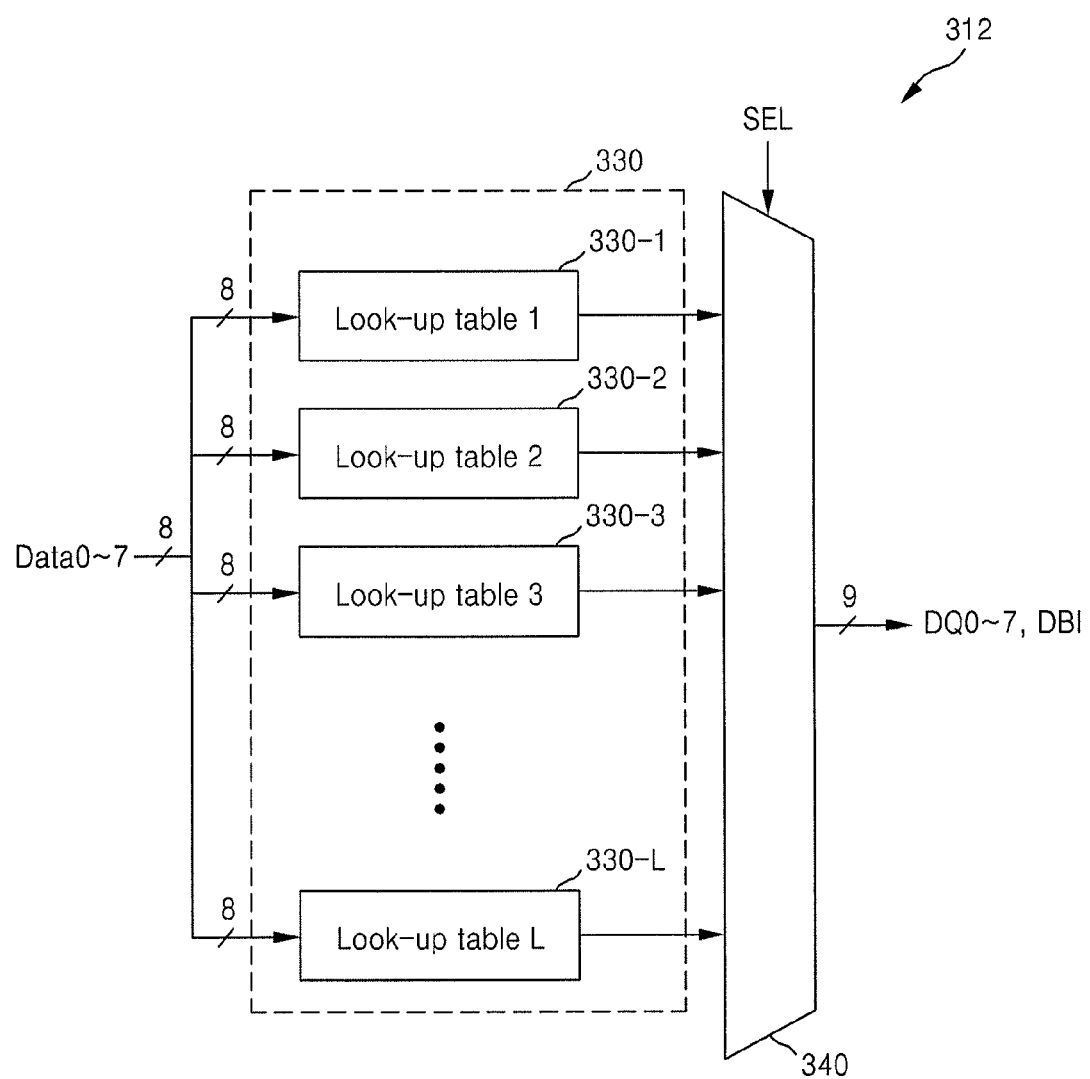
FIG. 2A illustrates a schematic diagram of an encoder according to one or more embodiments.

FIG. 2A illustrates a schematic diagram of an exemplary embodiment of an encoder, e.g., the first encoder 312. Referring to FIG. 2A, the first encoder 312 may include an encoding lookup table unit 330 and a selection unit 340.

The encoding lookup table unit 330 may include a plurality of encoding lookup tables 330-1 through 330-L (where L is 2 or an integer greater than 2), each storing encoded data corresponding to input parallel data Data0~7. In other words, each of the encoding lookup tables 330-1 through 330-L may store an encoded data pattern corresponding to a pattern of an input parallel data. The input parallel data may be N (e.g., 8) bits in length and encoded data may be M bits in length. In one or more embodiments, e.g., M may be greater than N. The encoded data may be obtained by performing direct current (DC) balance encoding on the input parallel data. In one or more embodiments, an encoded data pattern corresponding to the same input parallel data pattern is different among the encoding lookup tables 330-1 through 330-L. Alternatively, the encoded data may be obtained by performing DC balance encoding on the input parallel data after being scrambled or by scrambling a result of performing DC balance encoding the input parallel data.

Each of the encoding lookup tables 330-1 through 330-L may receive the input parallel data Data0~7 and may output encoded data to which the input parallel data Data0~7 may be mapped. The selection unit 340 may select, in response to a selection signal SEL, one set of encoded data from among a plurality of (i.e., L) sets of encoded data output from the encoding lookup tables 330-1 through 330-L and may output the selected encoded data set.

Consequently, the first encoder 312 may extract and may output encoded data, which corresponds to the selection signal SEL and to which the input parallel data Data0~7 is mapped, from the encoding lookup tables 330-1 through 330-L. At this time, the selection signal SEL may be at least part of one signal among an address signal, a burst length signal, and/or a command signal. For instance, a part of an address signal transmitted from the first semiconductor device 310 to the second semiconductor device 320 to store data in or read data from the second semiconductor device 320 may be used as the selection signal SEL.

As described above, in one or more embodiments, input parallel data is mapped to encoded data having different random (or pseudo-random) patterns spatially and temporally using the encoding lookup tables 330-1 through 330-L. The encoded data may be selected using the selection signal SEL, and therefore, even if input parallel data having the same pattern is sequentially input, output encoded data will be different. As a result, the pattern of the encoded data may be more random spatially and temporally.

Encoded data stored in the encoding lookup tables 330-1 through 330-L may have patterns that minimize switching noise and crosstalk. The characteristics of the encoded data will be described in more detail below.

Referring to FIG. 2A, the encoding lookup table unit 330 may output L sets of encoded data with respect to one input parallel data pattern and one encoded data set is selected. However, embodiments are not restricted to the exemplary embodiment of FIG. 2A. For instance, only one of the encoding lookup tables 330-1 through 330-L may be enabled in response to the selection signal SEL and encoded data corresponding to an input parallel data pattern may be output from the enabled lookup table.

Referring to FIG. 1, the first output driver 314 may receive output data of the first encoder 312 and may transmit it to the second semiconductor device 320 through a plurality of data lines. At this time, the first output driver 314 may sequentially transmit burst data of M*K (where K is a burst length and is 2 or an integer greater than 2) bits to the second semiconductor device 320 by transmitting, in parallel, M bits at a time.

The second semiconductor device 320 may include a second receiver 321, a second decoder 322, a data storage unit 323, a second encoder 324, and a second output driver 325. The second receiver 321 may receive parallel data from the first output driver 314. The second decoder 322 may combined-decode, e.g., spatially and temporally decode, an output of the second receiver 321 to restore the first parallel data D1N. If there is no error, restored parallel data D2N is the same as the input data D1N of the first encoder 312 of the first semiconductor device 310. The restored parallel data D2N may be obtained by, e.g., DC balance decoding before descrambling or descrambling before DC balance decoding the parallel data received by the second receiver 321.

Figure 2B:
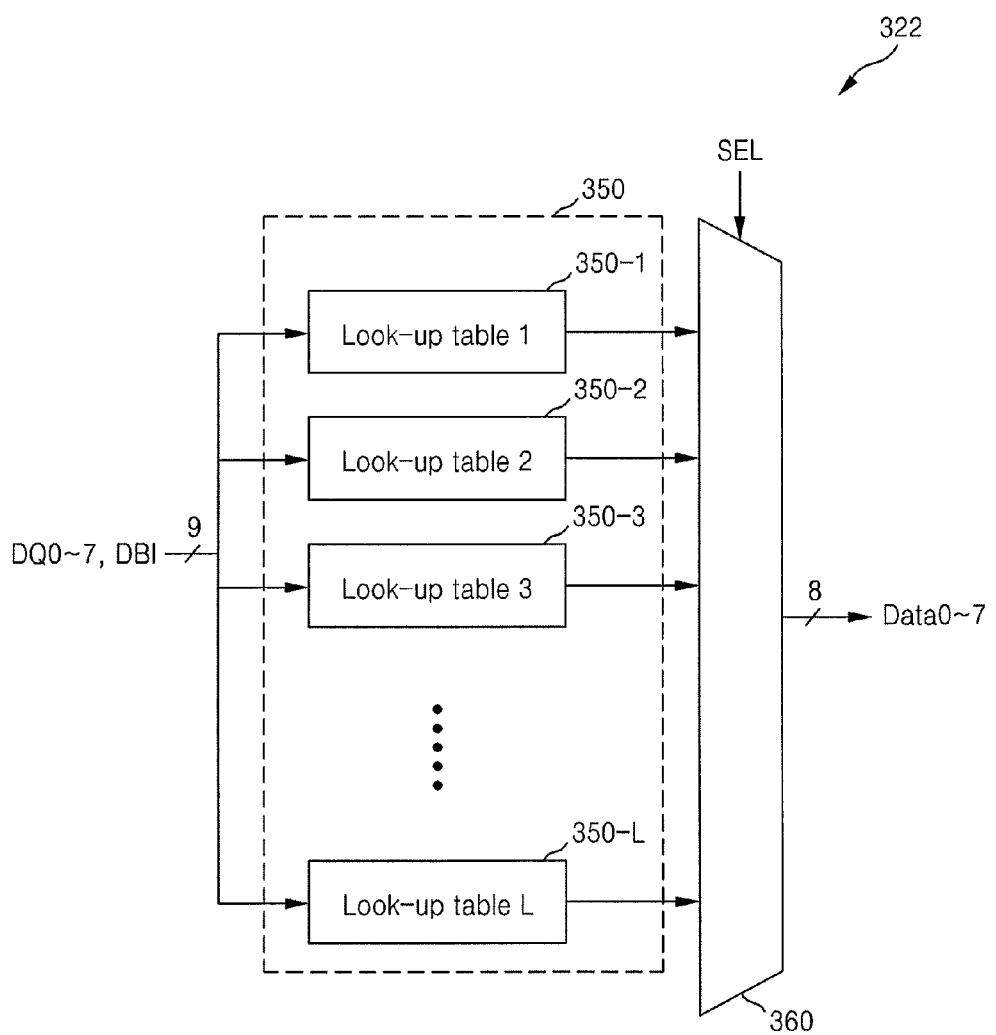
FIG. 2B illustrates a schematic diagram of a decoder according to one or more embodiments.

FIG. 2B illustrates a schematic diagram of a decoder, e.g., the second decoder 322, according to one or more embodiments. Referring to FIG. 2B, the second decoder 322 may include a decoding lookup table unit 350 and a selection unit 360. The decoding lookup table unit 350 may include a plurality of decoding lookup tables 350-1 through 350-L (where L is 2 or an integer greater than 2) each storing decoded data corresponding to input parallel data, i.e., encoded data. In other words, each of the decoding lookup tables 350-1 through 350-L may store a decoded data pattern corresponding to a pattern of an encoded data. In one or more embodiments, a decoded data pattern corresponding to the same encoded data pattern is different among the decoding lookup tables 350-1 through 350-L.

Each of the decoding lookup tables 350-1 through 350-L may receive encoded data and may output decoded data to which the encoded data is mapped. The selection unit 360 may select in response to a selection signal SEL one set of decoded data from among a plurality of (i.e., L) sets of decoded data output from the decoding lookup tables 350-1 through 350-L and may output the selected decoded data set.

Consequently, the second decoder 322 may extract and may output decoded data corresponding to the selection signal SEL and to which the encoded data is mapped, from the decoding lookup tables 350-1 through 350-L. At this time, the selection signal SEL may be at least part of an address signal or a command signal transmitted from the first semiconductor device 310 to the second semiconductor device 320 or a part of a signal (e.g., a burst length signal) stored in a particular register (e.g., a mode register set) of the second semiconductor device 320.

In the embodiment illustrated in FIG. 2B, the decoding lookup table unit 350 may output L sets of decoded data with respect to one encoded data pattern and one decoded data set may be selected. However, embodiments are not restricted to the exemplary embodiment of FIG. 2B. For instance, only one of the decoding lookup tables 350-1 through 350-L may be enabled in response to the selection signal SEL and decoded data corresponding to encoded data pattern may be output from the enabled lookup table.

Referring back to FIG. 1, the data storage unit 323 may store the decoded data, i.e., the restored parallel data or second parallel data D2N. The data storage unit 323 may be a memory cell array including a plurality of memory cells.

The second encoder 324 may receive the second parallel data D2N stored in the data storage unit 323 and may generate M-bit second encoded data D2M. The second encoder 324 may generate the second encoded data D2M using the same encoding method used by the first encoder 312. In one or more embodiments, the structure and the operation of the second encoder 324 may be the same as the structure and/or the operation of the first encoder 312, and therefore, detailed descriptions thereof will be omitted. The second output driver 325 may receive the second encoded data D2M and may transmit it to the first semiconductor device 310.

The first receiver 315 of the first semiconductor device 310 may receive parallel data output from the second semiconductor device 320. The first decoder 316 may combined-decode an output of the first receiver 315. The structure and the operation of the first decoder 316 may be the same as the structure and/or the operation of the second decoder 322, and therefore, detailed descriptions thereof will be omitted.

Figure 3:
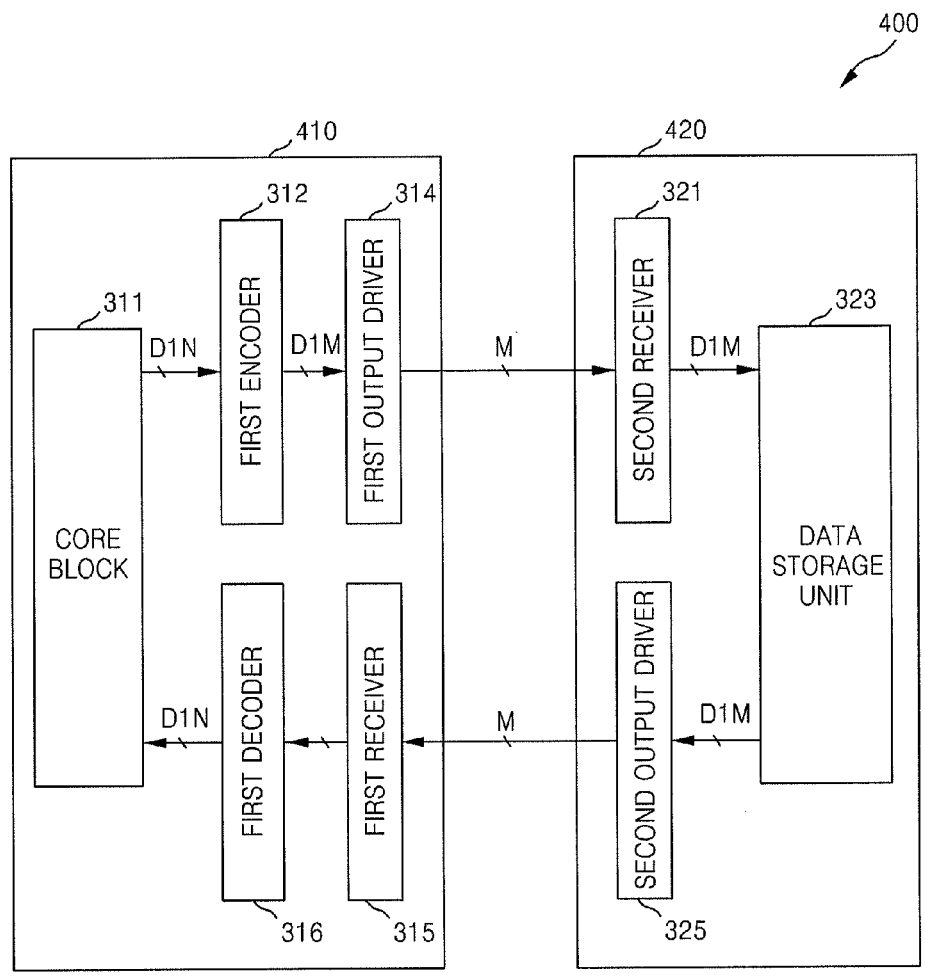
FIG. 3 illustrates a diagram of a system using single-ended parallel interface according to one or more other embodiments.

FIG. 3 illustrates a diagram of a parallel interface system 400 using single-ended parallel interface according to one or more other exemplary embodiments.

Referring to FIG. 3, the parallel interface system 400 may include a first semiconductor device 410 and a second semiconductor device 420. In general, only differences between the exemplary embodiment of the system 400 of FIG. 3 and the exemplary embodiment of the system 300 of FIG. 1 will be described below. The first semiconductor device 410 may correspond to, e.g., have the same structure and/or operation as, the first semiconductor device 310 illustrated in FIG. 1, and therefore, descriptions thereof will be omitted to avoid redundancy. The second semiconductor device 420 may have a similar structure to that of the second semiconductor device 320 illustrated in FIG. 1, but may not include the second decoder 322 and the second encoder 324.

The second receiver 321 of the second semiconductor device 420 may receive parallel data from the first output driver 314 of the first semiconductor device 410. The received data may be stored in the data storage unit 323 without being combined-decoded. The combined-decoding may correspond to combined-decoding performed by the first encoder 312 of the first semiconductor device 410 and any other decoding (e.g., cyclic redundancy check (CRC) decoding) that may be performed. Since the data may be stored in the data storage unit 323 without being combined-decoded by the second semiconductor device 420, the stored data may be combined-encoded data, i.e., spatially and temporally random data. The second output driver 325 may receive the encoded data from the data storage unit 323 and may transmit it to the first semiconductor device 410.

More particularly, referring to FIG. 1, when N-bit parallel data is transmitted between first and second semiconductor devices 310, 320, combined-decoded data, i.e., restored N-bit parallel data may be stored in the data storage unit 323 illustrated in FIG. 1. Referring to FIG. 3, when N-bit parallel data is transmitted between the first and second semiconductor devices 410, 420, encoded data, i.e., combined-encoded M-bit parallel data may be stored in the data storage unit 323 illustrated in FIG. 3.

Figure 8:
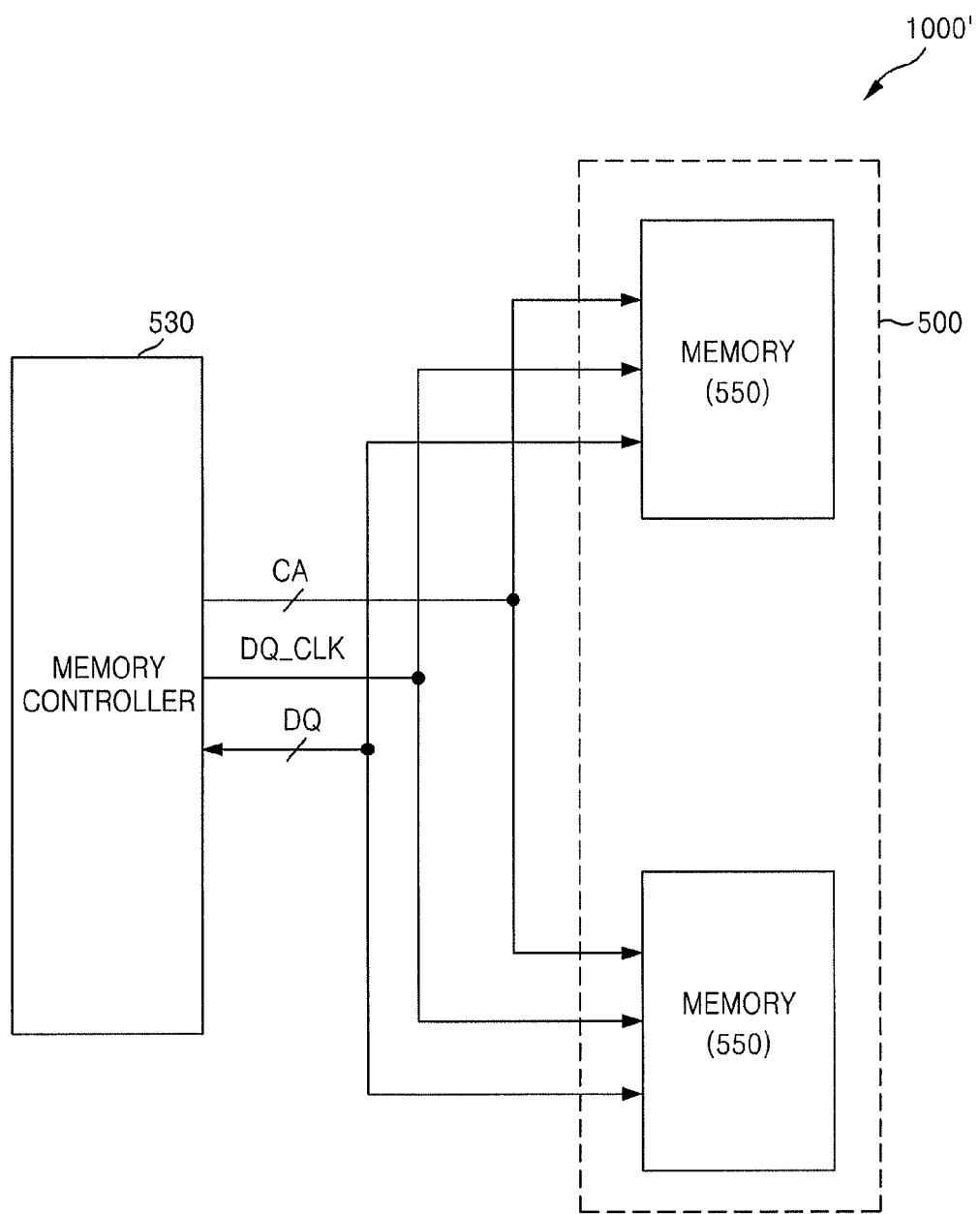

FIG. 4A illustrates a diagram of parallel data DQ1 through DQ10 coded using conventional 8B/10B balance coding. Referring to FIG. 4A, 8-bit parallel data is converted into 10-bit parallel data DQ1 through DQ10 through the 8B/10B balance coding. The 10-bit parallel data DQ1 through DQ10 transmitted during a single period has a maximum difference of 2 between the number of 0s and the number of 1s. However, when the 10-bit parallel data DQ1 through DQ10 temporally changes as shown in a dotted box of FIG. 4A, all of 10 bits change, maximizing switching noise, and crosstalk is also maximized due to an increase of influence by electrical coupling of data signals transmitted to data channels.

FIG. 4B illustrates a diagram of combined-encoded parallel data DQ1' through DQ10' according to one or more embodiments. Referring to FIGS. 1 and 4B, the combined-encoded parallel data DQ1' through DQ10' is a result of encoding combining scrambling and 8B/10B balance coding. In other words, an encoded data group Code0 through Code4 is data in which bits having a first logic level "0" and bits having a second logic level "1" are randomly distributed spatially and temporally through scrambling and 8B/10B balance coding. "Being randomly distributed spatially" means that positions of "0" and "1" are random in data simultaneously transmitted in parallel. "Being randomly distributed temporally" means that positions of "0" and "1" are random in data sequentially transmitted through one data line.

As a result, the odds are very small that the case of the dotted box of FIG. 4A occurs in the encoded data group Code0 through Code4 illustrated in FIG. 4B. In addition, as shown in a dotted box of FIG. 4B, a probability that each bit in the encoded parallel data DQ1' through DQ10' has different data values between a current period and a subsequent period is 50%. Accordingly, in one or embodiments, when parallel data is combined-encoded and transmitted, switching noise and crosstalk may be reduced relative to comparable conventional devices.

Figure 4C:
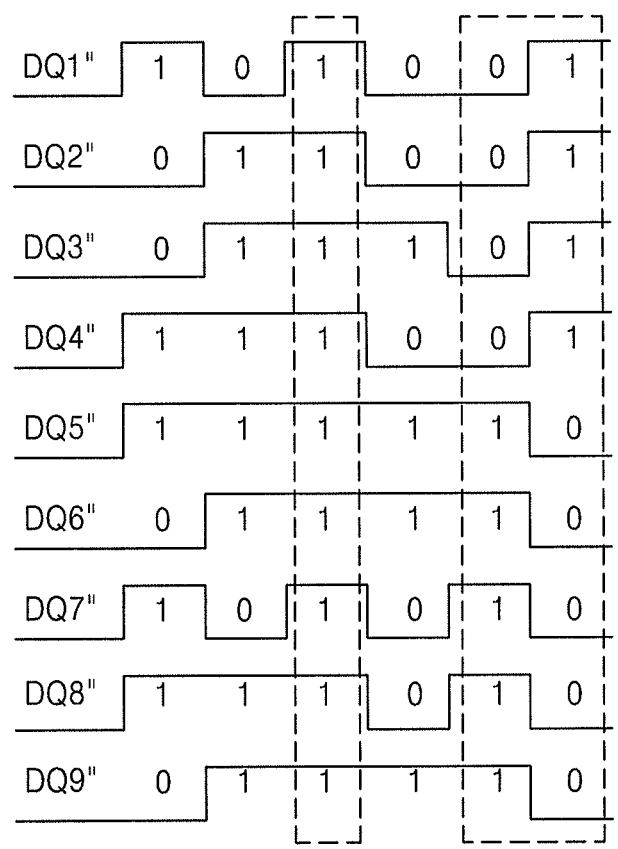
FIG. 4C illustrates a diagram of parallel data coded using conventional DBI DC balance coding.

FIG. 4C illustrates a diagram of parallel data DQ1" through DQ9" coded using conventional data bus inversion (DBI) DC balance coding. Referring to FIG. 4C, 8-bit parallel data is converted into 9-bit parallel data DQ1" through DQ9" through DBI DC balance coding. The first dotted box of FIG. 4C shows a case where a balance code is not achieved even through the DBI DC balance coding is used. When the number of 1s is zero or one in the 8-bit parallel data, a balance code is not achieved even through the DBI DC balance coding is used. A probability that the balance code is not achieved is 10/256. Like in the 8B/10B balance coding, switching noise also increases in the DBI DC balance coding when all bits of the 9-bit parallel data DQ1" through DQ9" change temporally as shown in the second dotted box of FIG. 4C.

Figure 4D:
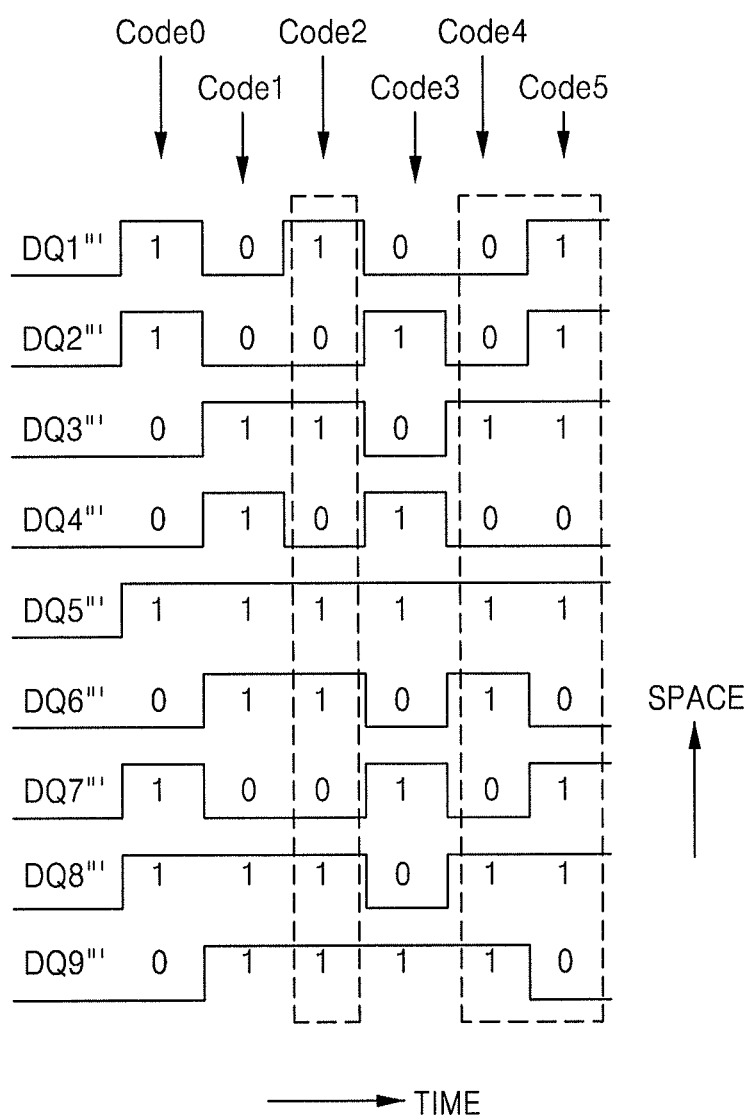
FIG. 4D illustrates a diagram of encoded parallel data according to one or more other embodiments.

FIG. 4D shows combined-encoded parallel data DQ1''' through DQ9''' according to one or more other embodiments. Referring to FIGS. 1 and 4D, the combined-encoded parallel data DQ1''' through DQ9''' is a result of encoding combining scrambling and DBI DC balance coding. In other words, an encoded data group Code0 through Code5 is data in which bits having the first logic level "0" and bits having the second logic level "1" are randomly distributed spatially and temporally through scrambling and DBI DC balance coding.

Accordingly, the odds are very small that the combined-encoded parallel data DQ1''' through DQ9''' has the parallel data patterns shown in the first and second dotted boxes of FIG. 4C. As a result, when parallel data is combined-encoded and transmitted according to the current embodiment, switching noise is decreased temporally and a balance code is achieved spatially.

Figure 5A:
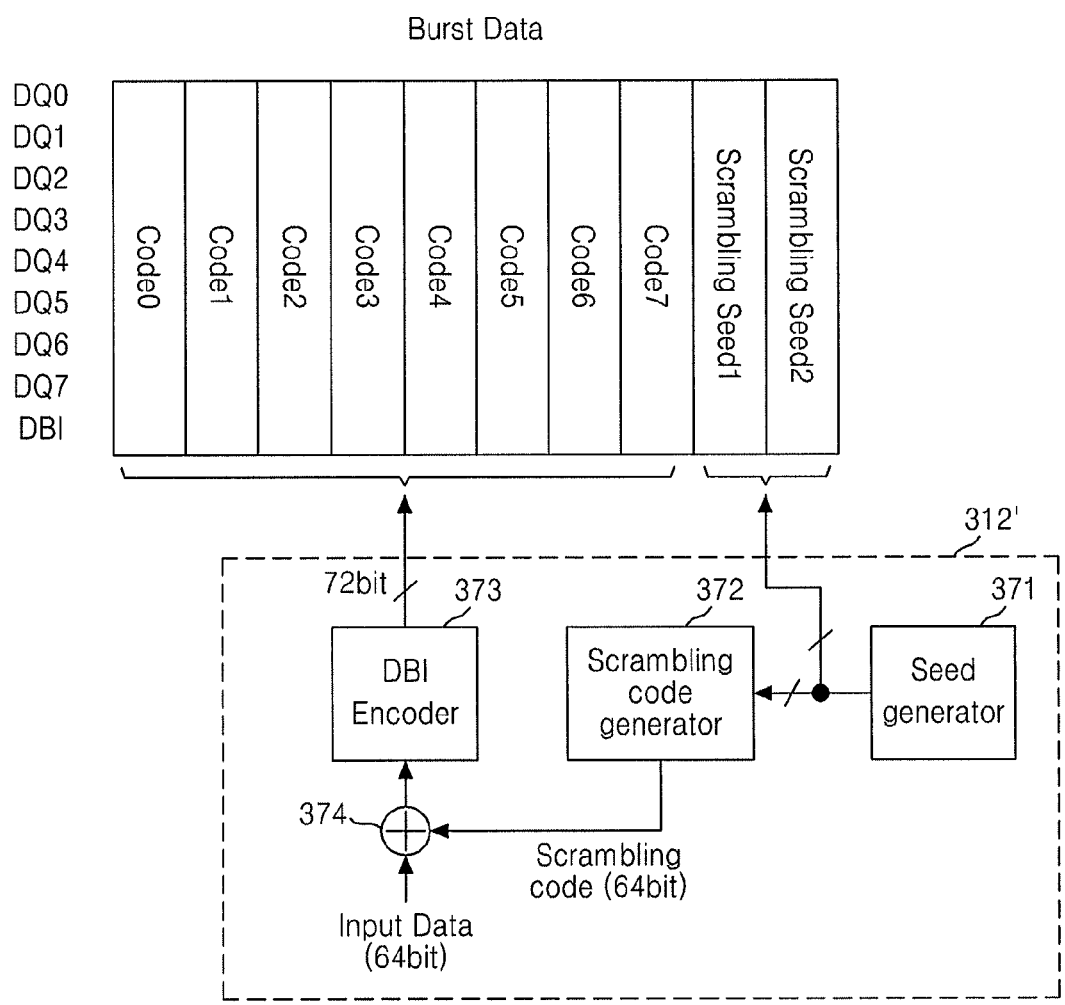
FIG. 5A illustrates a schematic diagram of an encoder according to one or more other embodiments.

FIG. 5A illustrates a schematic diagram of the structure of an encoder 312' according to one or more other embodiments. In general, only differences between the exemplary encoder 312' of FIG. 5A and the exemplary encoder 312 of FIG. 2A will be described below. The encoder 312' may include a seed generator 371, a scrambling code generator 372, a balance encoding block 373, and a scrambler 374.

The seed generator 371 may generate a seed used to generate a scrambling code. The seed may be stored in advance in a register or a part of one signal among an address signal, a burst length signal/or and a command signal.

The scrambling code generator 372 may generate a scrambling code using the seed. The scrambling code may be a pseudo-random binary-sequence code. The scrambling code generator 372 may be implemented by a random number sequence generator that generates a random number sequence using a seed, but embodiments not restricted thereto.

The scrambler 374 may scramble a first parallel data group using the scrambling code to generate a second parallel data group. The scrambler 374 may include a logical operator that performs an exclusive OR operation on each of the bits in the first parallel data group and each of bits in the scrambling code. The first parallel data group may be data including at least two sets of N (e.g., 8)-bit parallel data. In the exemplary embodiment of FIG. 5A, the first parallel data group is 64-bit data including 8 sets of 8-bit parallel data, and the scrambling code is also 64-bit data. In the exemplary embodiment of FIG. 5A, a burst length is 8, and the length of the first parallel data group is (number of bits in parallel data)*(burst length).

The scrambler 374 may perform an exclusive OR operation on the 64 bits in the first parallel data group and the 64 bits in the scrambling code one on one, thereby generating a 64-bit second parallel data group. For clarity of the description, particular numeral values, i.e., 8 bits and 64 bits are used, but the length of the first parallel data group and the scrambling code may be changed.

The balance encoding block 373 may receive the second parallel data group and may perform DC balance encoding on each set of 8-bit scrambled parallel data in the second parallel data group, and may thereby generate M-bit balance codes Code0 through Code7. In the exemplary embodiment of FIG. 5A, the balance encoding block 373 is a DBI DC encoder and may selectively invert 8-bit scrambled parallel data sets according to the number of bits having the first or second logic level in each of the 8-bit scrambled parallel data sets and adds a flag signal DBI indicating inversion or non-inversion to each 8-bit scrambled parallel data set. In one or more embodiments, the balance encoding block 373 is not restricted to a DBI DC encoder or the DBI DC encoder using the 1-bit flag signal DBI shown in FIG. 5A. For instance, the balance encoding block 373 may be implemented by a DBI DC encoder using a 2-bit flag signal, as disclosed in U.S. Pat. No. 7,495,587.

Referring to FIGS. 1 and 5A, the output driver 314 may sequentially output the balance codes Code0 through Code7 and the seed data through a plurality of data lines. For instance, the output driver 314 may sequentially output the balance codes Code0 through Code7 each including bits DQ0 through DQ7 and a flag signal DBI beginning with the Code0 during 8 unit intervals (UIs) and then output the seed data. At this time, UI is the length of one bit or symbol. Accordingly, in the exemplary embodiment of FIG. 5A, the balance code Code0 is output during the first UI and then balance code Code1 is output during the next UI. After the last balance code Code7 is output in parallel during the eighth UI, the seed data may be output through the plurality of data lines.

In one or more embodiments, the seed data may be transmitted through the data lines after the data is transmitted, and therefore, a separate line or pin is not necessary to transmit the seed data. Embodiments are not however limited thereto. The amount of UIs necessary to transmit the seed data may be different depending on the number of bits in the seed data and when the seed data is transmitted may also be different. For example, the seed data may be transmitted before the burst data is transmitted.

Figure 5B:
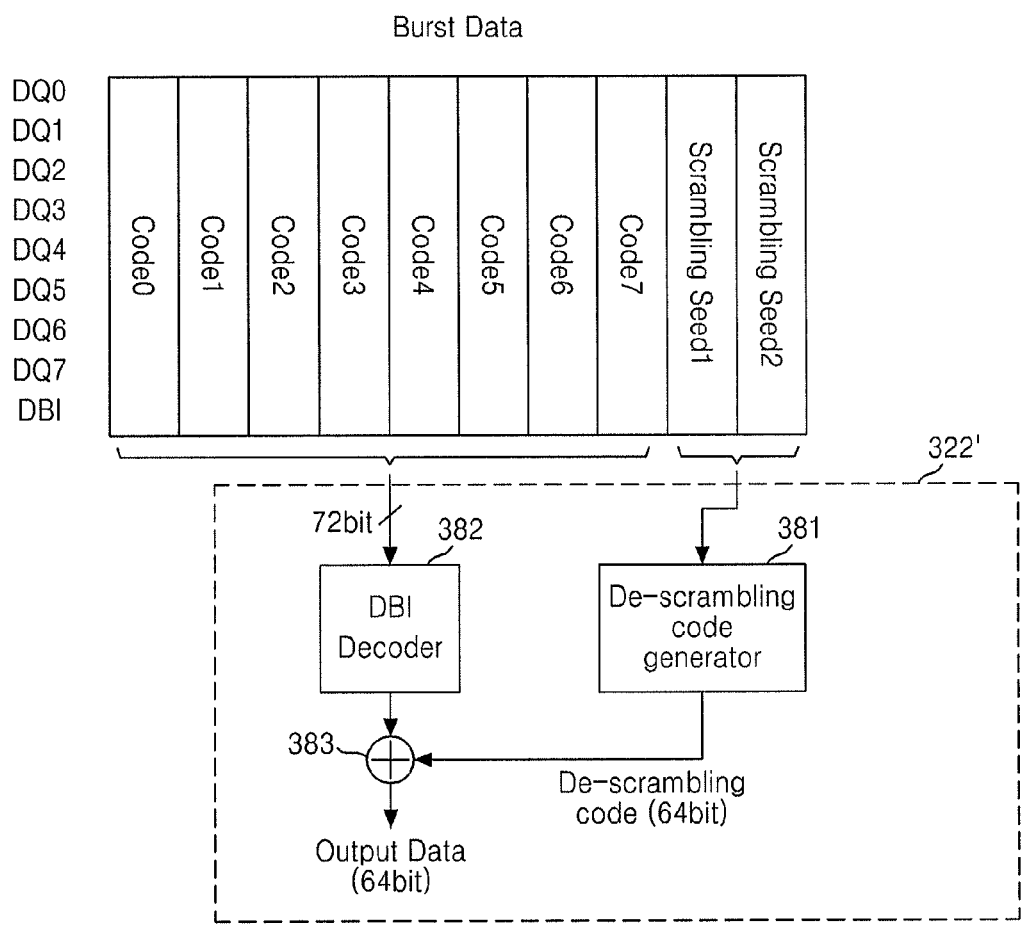
FIG. 5B illustrates a schematic diagram of a decoder according to one or more other embodiments.

FIG. 5B illustrates a schematic diagram of the structure of a combined-decoder 322' according to other exemplary embodiments. In general, only differences between the exemplary decoder 322' of FIG. 5B and the exemplary decoder 322 of FIG. 2B will be described below. Referring to FIG. 5B, the decoder 322' may include a descrambling code generator 381, a balance decoding block 382, and a descrambler 383.

The descrambling code generator 381 may generate a descrambling code using a seed. The descrambling code generator 381 may be implemented to be the same as the scrambling code generator 372 shown in FIG. 5A. The descrambling code may a pseudo-random binary-sequence code and may be the same as the scrambling code. The seed may be received through a plurality of data lines. For example, the second receiver 321 may sequentially receive M-bit balance codes and the seed through the plurality of data lines and may provide the seed to the descrambling code generator 381.

The balance decoding block 382 may receive a 72-bit parallel data group (i.e., burst data) including the plurality of balance codes Code0 through Code7 and performs DC balance decoding the 9-bit scrambled balance codes Code0 through Code7 in the parallel data group, and may thereby generate 8 sets of 8-bit scrambled parallel data DQ0 through DQ7. In such embodiments, an output of the balance decoding block 382 may be 64-bit scrambled data.

In one or more embodiments, the balance decoding block 382 may be a DBI DC decoder and may selectively invert the 8 sets of the 8-bit scrambled parallel data DQ0 through DQ7 according to a flag signal DBI. As described above, embodiments of the balance decoding block 382 are not be restricted to a DBI DC decoder and a DBI DC decoder using the 1-bit flag signal DBI shown in FIG. 5B.

The descrambler 383 may descramble the 64-bit scrambled data output from the balance decoding block 382 using the descrambling code (e.g., a 64-bit random number sequence) and may generate descrambled data. The descrambler 383 may include a logical operator that performs an exclusive OR operation on bits in the data output from the balance decoding block 382 and bits in the descrambling code one on one. Referring to FIGS. 1 and 5B, output data of the descrambler 383 may be stored in the data storage unit 323.

Figure 6:
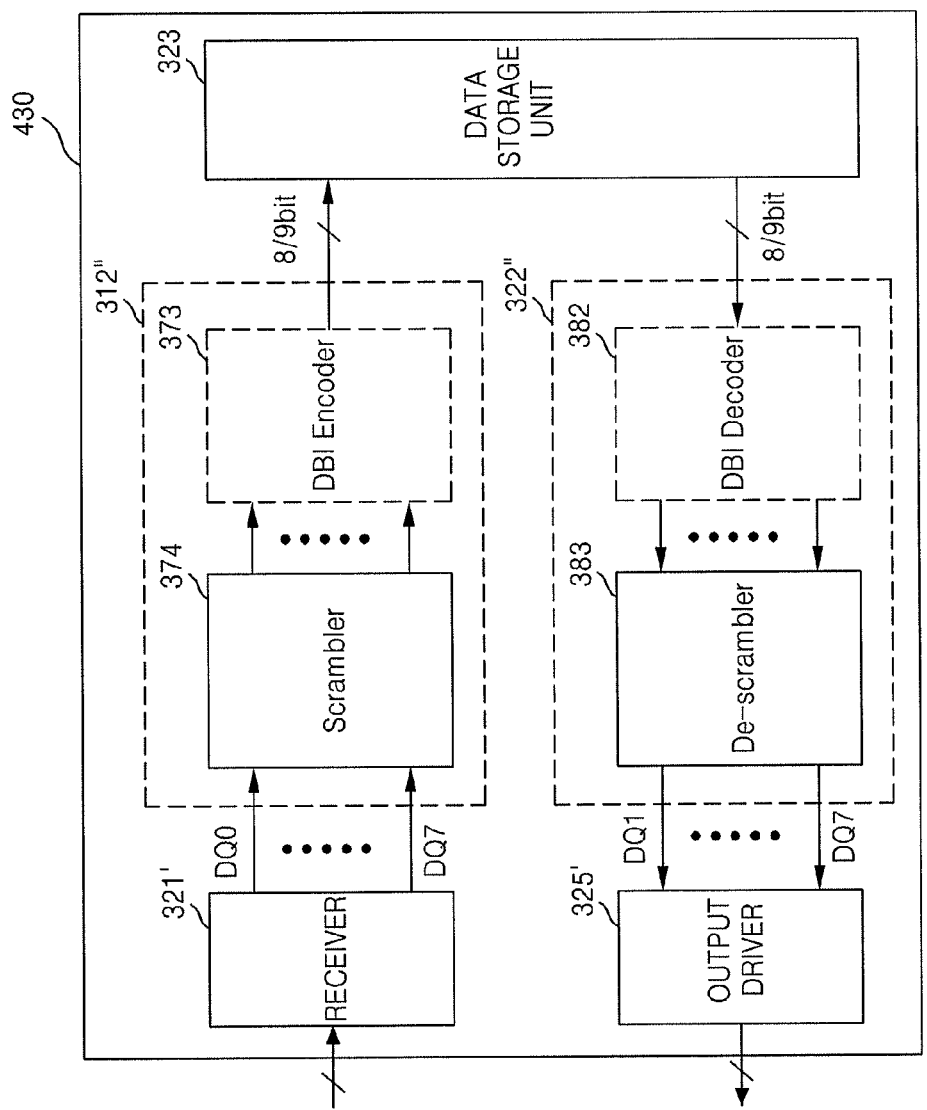
FIG. 6 illustrates a schematic diagram of a memory device according to one or more embodiments.

FIG. 6 illustrates a schematic diagram of an exemplary memory device 430 according to some embodiments. The memory device 430 may have a similar function and structure to that of the first or second semiconductor device 310, 410, 320, or 420. Thus, in general, only differences between the memory device 430 and the semiconductor device 310, 410, 320, or 420 will described to avoid redundancy. The memory device 430 may include a receiver 321', an encoder 312", the data storage unit 323, a decoder 322", and an output driver 325'.

The memory device 430 may store data in compliance with a memory controller (not shown). The receiver 321' may receive a first parallel data group transmitted from the memory controller through a plurality of data lines based on a write command of the memory controller.

The encoder 312" may include the scrambler 374, the scrambling code generator 372, and the balance encoding block 373. The structures and the operations of the scrambler 374, the scrambling code generator 372, and the balance encoding block 373 may be the same as those described with reference to FIG. 5A, and therefore, detailed descriptions thereof will be omitted. In one or more embodiments, the encoder 312" may be implemented using a lookup table, as show in FIG. 2A. The data storage unit 323 may receive encoded data through an internal bus and may store the encoded data.

In the systems 300 and 400 illustrated in FIGS. 1 and 3, combined-encoding may be performed in one semiconductor device 310 or 410 and encoded data may be transmitted to another semiconductor device 320 or 420 in order to reduce switching noise and DC current variation which occur in parallel interface between at least two devices. Unlike these systems 300 and 400, the memory device 430 illustrated in FIG. 6 may store received parallel data in the internal data storage unit 323 after scrambling or combined-encoding the parallel data.

With the increase of the degree of integration of a memory device and the amount of data transmitted during parallel interface, it has become important to reduce noise such as crosstalk occurring during internal data transmission in the memory device. In one or more embodiments, parallel data may be scrambled or combined-encoded such that bits of "0" and "1" are spatially and temporally scattered when the parallel data is transmitted through an internal bus. As a result, one or more embodiments may provide a memory device in which noise such as crosstalk may be reduced and/or minimized during internal data transmission within the memory device. One or more embodiments may provide a memory device having improved performance relative to comparable conventional devices.

The decoder 322" may descramble or combined-decode parallel data output from the data storage unit 323. The output driver 325' may output output data of the decoder 322" to an outside. The decoder 322" includes the balance decoding block 382 and the descrambler 383. In general, the structures and the operations of the balance decoding block 382 and the descrambler 383 may be the same as those described with reference to FIG. 5B, and therefore, detailed descriptions thereof will be omitted. The decoder 322" may also include the descrambling code generator 381, as shown in FIG. 5B. In one or more embodiments, the decoder 322" may be implemented using a lookup table, as show in FIG. 2B.

Figure 7:
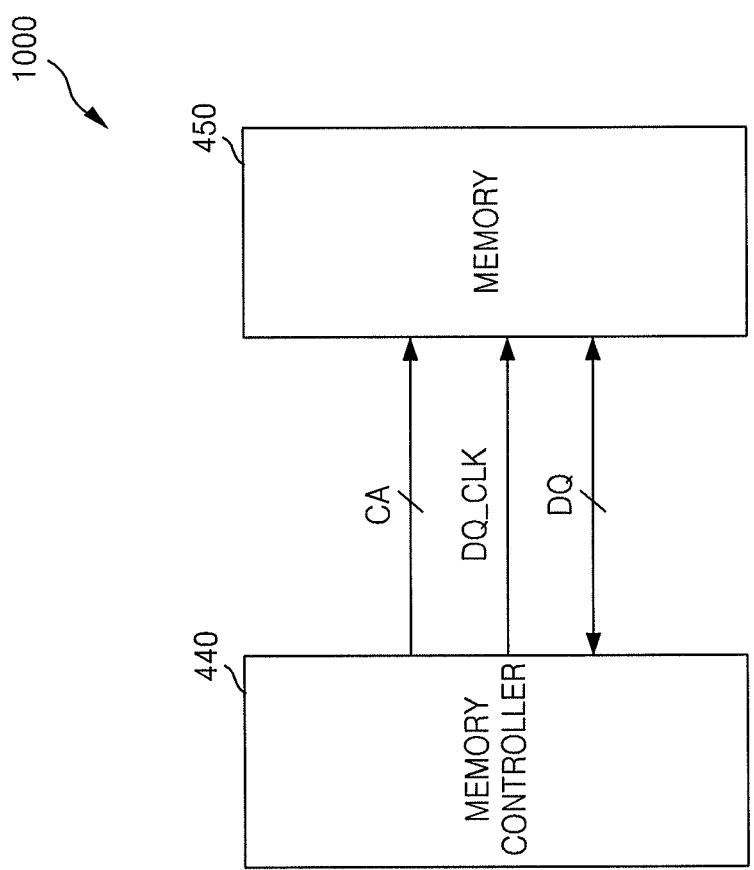
FIGS. 7 and 8 illustrate schematic diagrams of parallel interface systems according to exemplary embodiments.

FIGS. 7 and 8 illustrate schematic block diagrams of parallel interface systems 1000 and 1000' according to different exemplary.

Referring to FIG. 7, the parallel interface system 1000 may include a memory controller 440 and a memory device 450. The memory controller 440 may transmit a command/address signal CA to the memory device 450 so that an operation such as writing of data to the memory device 450 or reading of data from the memory device 450 may be performed.

The memory device 450 may perform input or output of data DQ using a clock signal DQ_CLK when receiving a write or read command from the memory controller 440. When parallel data is transmitted between the memory controller 440 and the memory device 450, the parallel data may be combined-encoded according to one or more embodiments described above before transmission. In one or more other embodiments, the memory device 450 may receive parallel data from the memory controller 440 and then internally combined-encode the parallel data before storing it.

Referring to FIG. 8, the parallel interface system 1000' may include a memory controller 530 and a plurality of memory devices 550. The memory controller 530 may transmit and receive combined-encoded data to and from the memory devices 550.

Figure 9B:
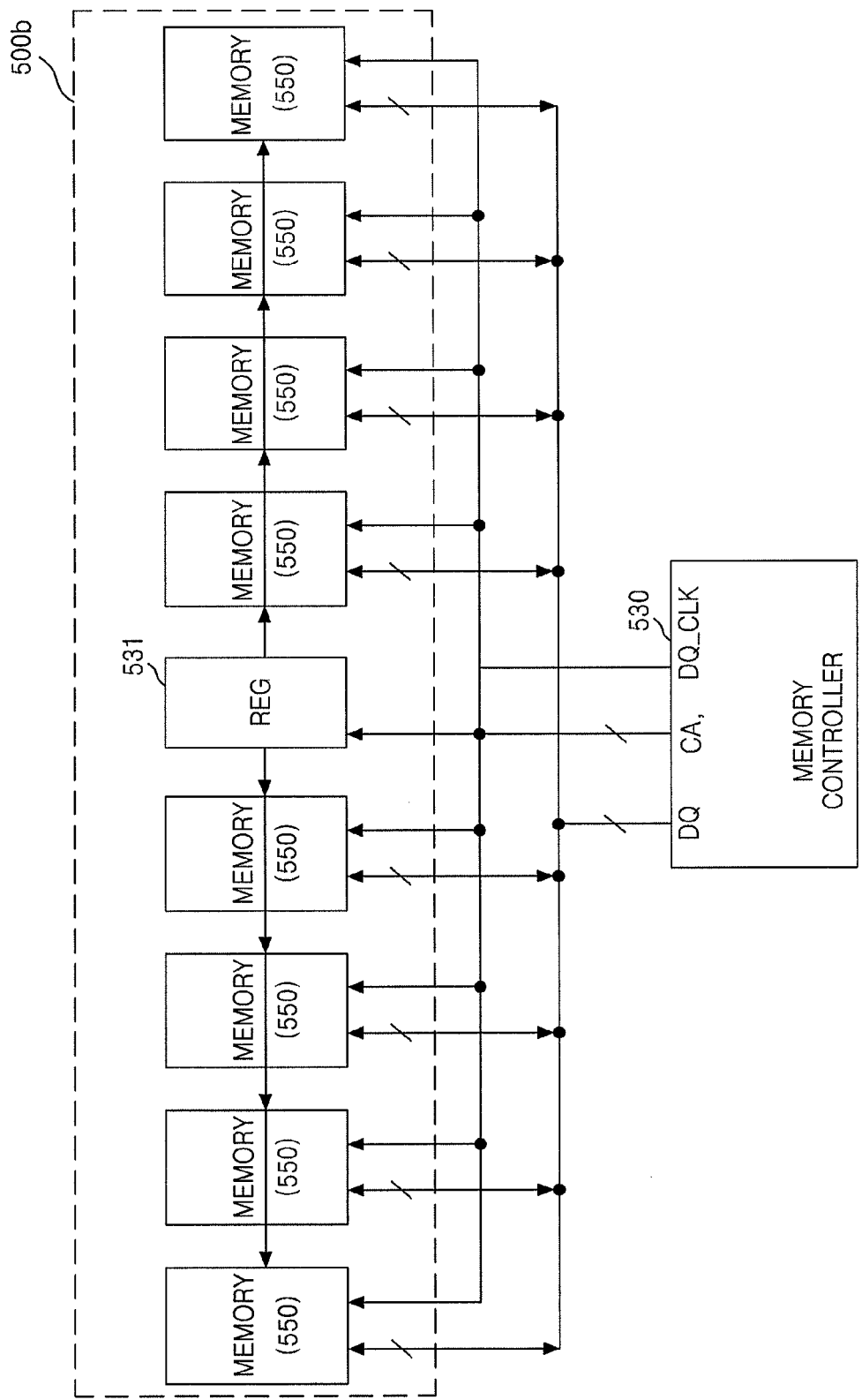

FIGS. 9A through 9C illustrate schematic diagrams of memory modules 500a through 500c according to different exemplary embodiments.

The memory module 500a illustrated in FIG. 9A is an example of an unbuffered dual in-line memory module (UDIMM). The memory module 500a may include a plurality of semiconductor memory devices 550 that may receive a command/address signal CA from the memory controller 530 and may perform input and output of data DQ in response to a clock signal DQ_CLK. The memory module 500a may also include a data wire connected to each of the semiconductor memory devices 550 as an input/output passage of the data DQ to an outside, a command/address wire for transmitting the command/address signal CA to the semiconductor memory devices 550, and a clock wire for providing the clock signal DQ_CLK to the semiconductor memory devices 550. The clock signal DQ_CLK, the command/address signal CA, and the data DQ may be input from the memory controller 530 to each of the semiconductor memory devices 550 in the memory module 500a without passing through a separate buffer.

The memory module 500b illustrated in FIG. 9B is an example of a registered dual in-line memory module (RDIMM). While the command/address signal CA is input to the semiconductor memory devices 550 in the memory module 500b through a register circuit 531, the clock signal DQ_CLK and the data DQ may be input to the semiconductor memory devices 550 without passing through the register circuit 531. The register circuit 531 may include a register for buffering the command/address signal CA. The register circuit 531 may be implemented on a chip set instead of the memory module 500b. In such embodiments, the register circuit 531 may be removed from the memory module 500b.

The memory module 500c illustrated in FIG. 9C is an example of a fully buffered dual in-line memory module (FBDIMM), that is, the memory module 500c is an example of a memory module including a buffer 532. The memory module 500c including the buffer 532 may be connected to an outside, i.e., the memory controller 530 through a single channel CH, as shown in FIG. 9C. The memory module 500c may be able to communicate with the outside only through the buffer 532. In other words, the semiconductor memory devices 550 included in the memory module 500c may receive the clock signal DQ_CLK, the command/address signal CA, and the data from the memory controller 530 and output the data DQ to the memory controller 530 only through the buffer 532 connected to the channel CH.

FIGS. 10A through 10D illustrate block diagrams of the structures of a memory system using the memory modules 500a through 500c illustrated in FIGS. 9A through 9C. Referring to FIGS. 10A through 10D, each of the memory systems may include a plurality of the memory modules, e.g., 500a, 500b, and/or 500c.

In the embodiments illustrated in FIGS. 10A through 10D, the memory controller 530 may perform combined-encoding of parallel data before transmitting the parallel data to each semiconductor memory device 550. In one or more embodiments, each semiconductor memory device 550 may internally perform combined-encoding of parallel data received from the memory controller 530 before storing it.

In the above-described embodiments, the memory controller, e.g., 440, 530, may transmit the clock signal DQ_CLK to the semiconductor memory devices 550 in the parallel interface systems, e.g., 1000, 1000', and the memory modules, e.g., 500a through 500c. Embodiments are not however limited thereto. For example, data strobe signal instead of the clock signal DQ_CLK may be used in other embodiments. In one or more other embodiments, instead of transmitting the clock signal DQ_CLK or the data strobe signal from a memory controller to a memory device, a clock signal may be restored from received data using a clock data recovery (CDR) method in the memory device, e.g., 550.

Figure 10B:
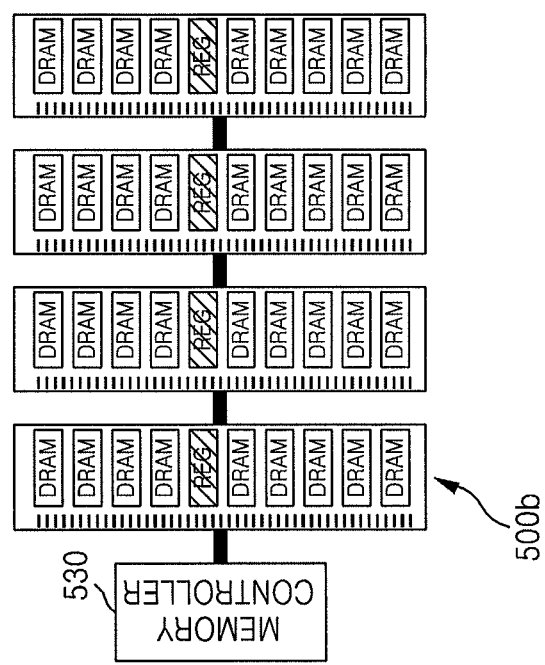
Figure 10C:
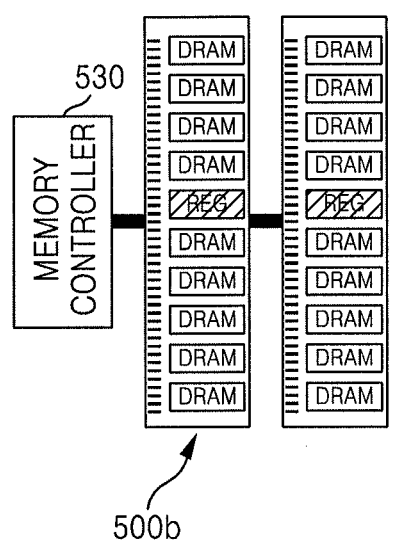
Figure 10D:
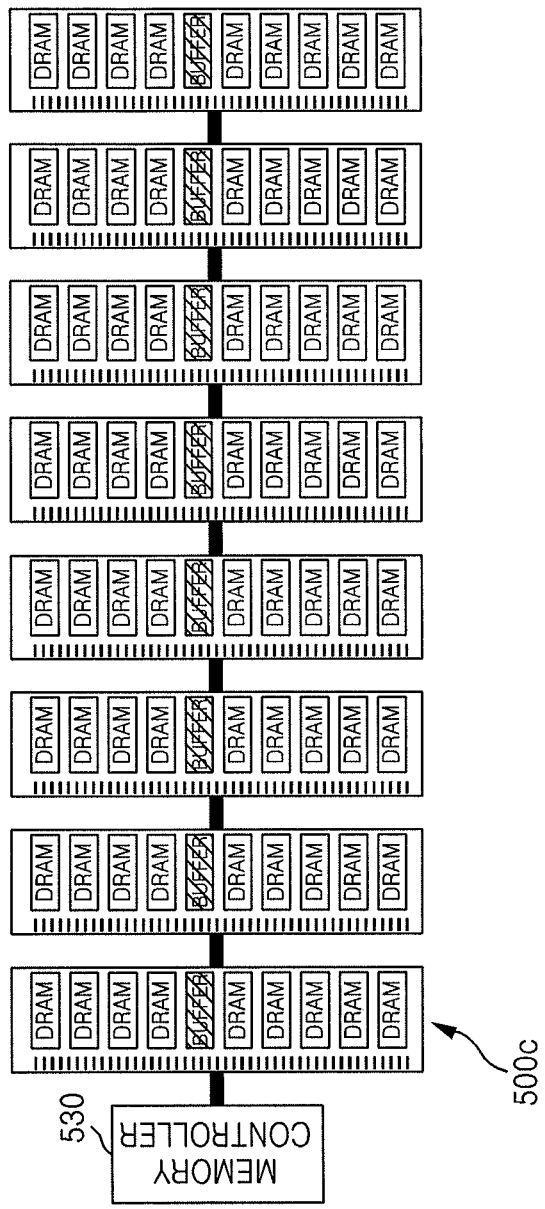
Figure 11:
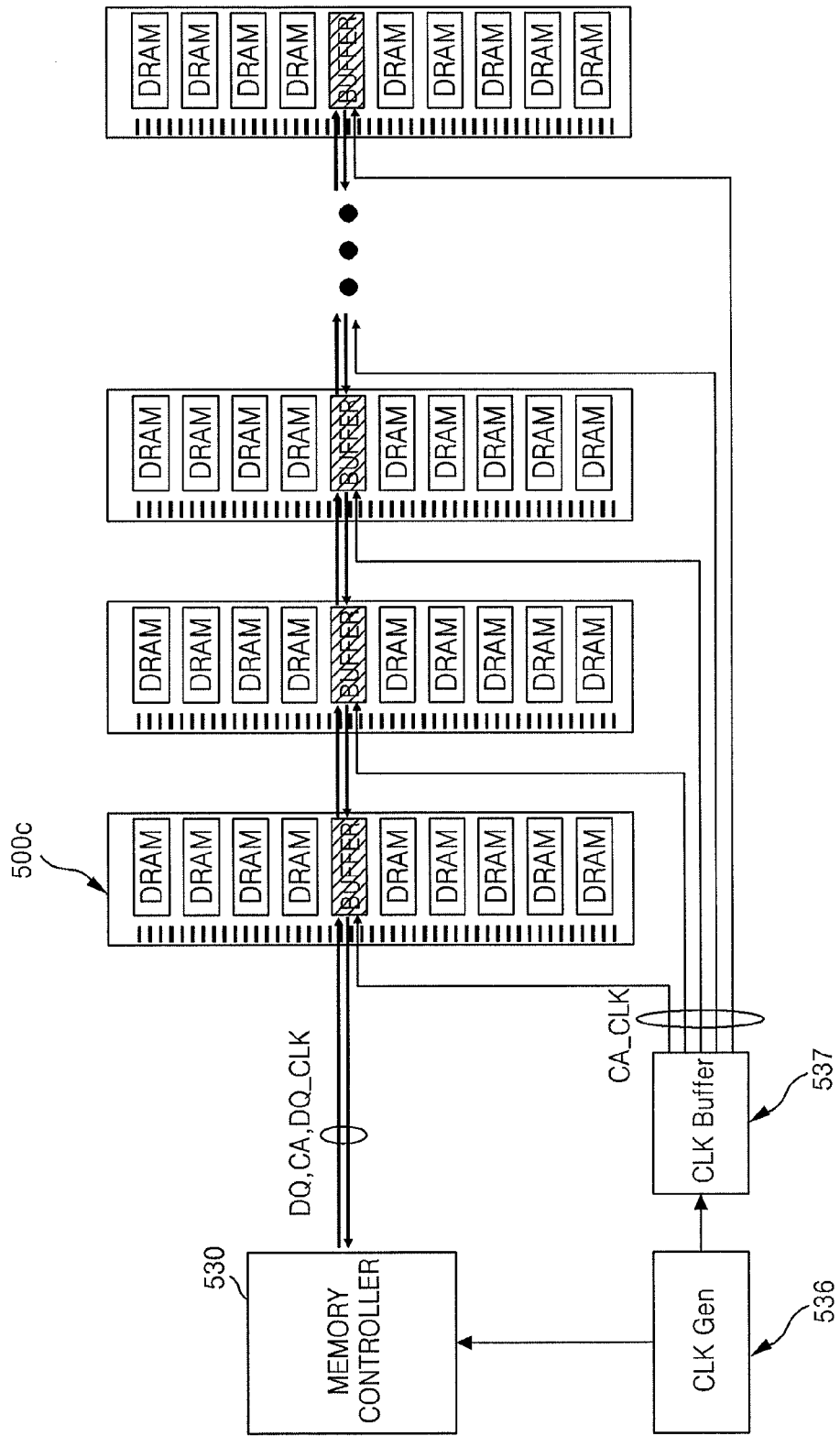
FIG. 11 illustrates exemplary signal paths in the memory system of FIG. 10D, according to one or more exemplary embodiments.

FIG. 11 illustrates a schematic diagram of exemplary signal paths in the exemplary memory system of FIG. 10D. More particularly, FIG. 11 is similar to FIG. 10D, but illustrates a clock generator 536 and a clock buffer 537 formed outside of the memory controller 530. The clock generator 536 and the clock buffer 537 may provide the CA_CLK signal to the memory modules 500c. Referring to FIG. 11, the memory controller 530 may communicate the data DQ, the command/address CA, and the DQ_CLK signal via respective buffers of the memory modules 500c.

One or more embodiments may provide computer readable codes on a computer readable recording medium. The computer readable recording medium is any data storage device that can store data which can be thereafter read by a computer system. More particularly, the computer readable recording medium may be, e.g., a tangible, non-transitory recording medium. Examples of the computer readable recording medium include read-only memory (ROM), random-access memory (RAM), CD-ROMs, magnetic tapes, and optical data storage devices. The computer readable recording medium can also be distributed over network coupled computer systems so that the computer readable code is stored and executed in a distributed fashion. Also, functional programs, codes, and code segments for accomplishing the present invention can be easily construed by programmers skilled in the art to which the present invention pertains.

As described above, in one or more embodiments, at least noise induced by DC current change and switching noise induced by the alternating current (AC) change of data may be reduced and/or minimized. In one or more embodiments, since bits of "0" and bits of "1" may be scattered temporally and spatially through combined-encoding, return current from a printed circuit board (PCB) may be reduced and/or minimized, and therefore, noise and crosstalk may also be reduced and/or minimized.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor device, comprising:
   a scrambling code generator configured to generate a scrambling code using a seed;
   a scrambler configured to scramble a first parallel data group, which includes at least two sets of N-bit parallel data, using the scrambling code and generate a second parallel data group, which includes at least two sets of N-bit scrambled parallel data, where N is 2 or an integer greater than 2;
   a balance encoding block configured to receive the second parallel data group, perform direct current (DC) balance encoding of the N-bit scrambled parallel data sets in the second parallel data group, and generate M-bit balance codes, where M is an integer greater than N; and
   an output driver configured to sequentially output the balance codes and the seed through a plurality of data lines.

2. The semiconductor device as claimed in claim 1, wherein the balance encoding block selectively inverts the N-bit scrambled parallel data sets according to the number of bits having a first logic level or a second logic level in each of the N-bit scrambled parallel data sets and adds a flag signal indicating inversion or non-inversion to each of the N-bit scrambled parallel data sets.

3. The semiconductor device as claimed in claim 1, wherein the scrambler comprises a logical operator configured to perform an exclusive OR operation on bits in the first parallel data group and bits in the scrambling code one on one.

4. The semiconductor device as claimed in claim 1, wherein the output driver is configured to sequentially output the balance codes one by one through the plurality of data lines before outputting the seed through the plurality of data lines.

5. A semiconductor device, comprising:
   a data receiver configured to receive M-bit balance codes, each of which is obtained by direct current (DC) balance encoding each sets of N-bit scrambled parallel data in a second parallel data group generated by scrambling a first parallel data group comprising at least two sets of N-bit parallel data, and a seed through a plurality of data lines, where M is 2 or an integer greater than 2 and N is an integer lesser than M;

a descrambling code generator configured to generate a descrambling code using the seed;

a balance decoding block configured to perform DC balance decoding of the balance codes and extract the second parallel data group comprising the at least two sets of N-bit scrambled parallel data; and a descrambler configured to descramble the second parallel data group extracted by the balance decoding block using the descrambling code and extract the first parallel data group.

6. The semiconductor device as claimed in claim 5, wherein the balance decoding block selectively inverts the balance codes according to a predetermined flag signal included in each of the balance codes.

7. The semiconductor device as claimed in claim 5, wherein the descrambler comprises a logical operator configured to perform an exclusive OR operation on bits in the second parallel data group and bits in the descrambling code one on one.

8. The semiconductor device as claimed in claim 5, wherein the data receiver sequentially receives the balance codes one by one through the plurality of data lines and then receives the seed through the plurality of data lines.

* * * * *